United States Patent
Otremba

(10) Patent No.: US 9,159,720 B2
(45) Date of Patent: Oct. 13, 2015

(54) SEMICONDUCTOR MODULE WITH A SEMICONDUCTOR CHIP AND A PASSIVE COMPONENT AND METHOD FOR PRODUCING THE SAME

(71) Applicant: Infineon Technologies AG, Neubiberg (DE)

(72) Inventor: Ralf Otremba, Kaufbeuren (DE)

(73) Assignee: Infineon Technologies AG, Neubiberg (DE)

(*) Notice: Subject to any disclaimer, the term of this patent is extended or adjusted under 35 U.S.C. 154(b) by 78 days.

(21) Appl. No.: 13/905,425

(22) Filed: May 30, 2013

(65) Prior Publication Data

US 2013/0285132 A1    Oct. 31, 2013

Related U.S. Application Data

(63) Continuation of application No. 11/782,125, filed on Jul. 24, 2007, now Pat. No. 8,466,561.

(30) Foreign Application Priority Data

Jul. 24, 2006   (DE) .................. 10 2006 034 679 U

(51) Int. Cl.
    *H01L 23/02*    (2006.01)
    *H01L 27/06*    (2006.01)
    (Continued)

(52) U.S. Cl.
    CPC ...... *H01L 27/0629* (2013.01); *H01L 23/49575* (2013.01); *H01L 23/49589* (2013.01); *H01L 24/05* (2013.01); *H01L 24/06* (2013.01); *H01L 24/49* (2013.01); *H01L 28/40* (2013.01); *H01L 23/49568* (2013.01); *H01L 24/48* (2013.01);
    (Continued)

(58) Field of Classification Search
    CPC . H01L 25/043; H01L 25/0657; H01L 25/117; H01L 27/0629; H01L 23/49575; H01L 23/49589; H01L 24/05; H01L 24/06; H01L 24/49; H01L 28/40; H01L 23/49568; H01L 224/05553
    USPC .......... 257/686, E25.006, E25.013, E25.021, 257/489, 523, 532, 666, 696, 723, 734
    See application file for complete search history.

(56) References Cited

U.S. PATENT DOCUMENTS 4,284,905 A * 8/1981 Rosenzweig ................. 326/88
4,685,026 A * 8/1987 Lavene ....................... 361/308.2
(Continued)

FOREIGN PATENT DOCUMENTS

DE     10339462 A1    3/2005
DE   102004019443 B3   8/2005
(Continued)

*Primary Examiner* — Galina Yushina
(74) *Attorney, Agent, or Firm* — Murphy, Bilak & Homiller, PLLC

(57) ABSTRACT

A semiconductor module includes a semiconductor chip and a passive discrete component. The semiconductor chip includes on its top side and/or on the back side one or more contacts, which in its two-dimensional extent takes up the top side and/or the back side of the semiconductor chip virtually completely. The passive component, arranged in a package, is stacked on one of the contacts. The electrode of the passive component is electrically connected with one of the contacts. The counter electrode of the passive component is operatively connected with a control or signal electrode of the semiconductor chip or an electrode of a further semiconductor chip.

20 Claims, 3 Drawing Sheets

(51) Int. Cl.
*H01L 23/00* (2006.01)
*H01L 49/02* (2006.01)
*H01L 23/495* (2006.01)

(52) U.S. Cl.
CPC ............... *H01L 2224/04042* (2013.01); *H01L 2224/05553* (2013.01); *H01L 2224/05556* (2013.01); *H01L 2224/05599* (2013.01); *H01L 2224/0603* (2013.01); *H01L 2224/32245* (2013.01); *H01L 2224/48091* (2013.01); *H01L 2224/48247* (2013.01); *H01L 2224/48465* (2013.01); *H01L 2224/48472* (2013.01); *H01L 2224/4945* (2013.01); *H01L 2224/73265* (2013.01); *H01L 2224/85191* (2013.01); *H01L 2224/85447* (2013.01); *H01L 2924/00014* (2013.01); *H01L 2924/014* (2013.01); *H01L 2924/01005* (2013.01); *H01L 2924/0105* (2013.01); *H01L 2924/01006* (2013.01); *H01L 2924/01014* (2013.01); *H01L 2924/01029* (2013.01); *H01L 2924/01033* (2013.01); *H01L 2924/01041* (2013.01); *H01L 2924/01047* (2013.01); *H01L 2924/01049* (2013.01); *H01L 2924/01068* (2013.01); *H01L 2924/01079* (2013.01); *H01L 2924/01082* (2013.01); *H01L 2924/01327* (2013.01); *H01L 2924/1305* (2013.01); *H01L 2924/1306* (2013.01); *H01L 2924/13055* (2013.01); *H01L 2924/13091* (2013.01); *H01L 2924/14* (2013.01); *H01L 2924/19041* (2013.01); *H01L 2924/19104* (2013.01)

(56) References Cited

U.S. PATENT DOCUMENTS

| | | | |
|---|---|---|---|
| 5,373,435 A * | 12/1994 | Jayaraman et al. | 363/98 |
| 5,502,632 A | 3/1996 | Warmerdam et al. | |
| 5,532,512 A | 7/1996 | Fillion et al. | |
| 6,242,970 B1 | 6/2001 | Grant et al. | |
| 6,281,096 B1 | 8/2001 | Ewer | |
| 6,519,134 B1 | 2/2003 | Li et al. | |
| 6,617,681 B1 | 9/2003 | Bohr | |
| 6,700,793 B2 | 3/2004 | Takagawa et al. | |
| 6,781,233 B2 | 8/2004 | Zverev et al. | |
| 6,915,945 B2 | 7/2005 | Hubner | |
| 6,927,483 B1 | 8/2005 | Lee et al. | |
| 7,026,801 B2 | 4/2006 | Fowler et al. | |
| 7,348,656 B2 * | 3/2008 | Briere | 257/532 |
| 2001/0040281 A1 | 11/2001 | Butler | |
| 2002/0075038 A1 | 6/2002 | Mathew et al. | |
| 2002/0096779 A1 | 7/2002 | Feldtkeller et al. | |
| 2005/0045369 A1 | 3/2005 | Ishimaru et al. | |
| 2005/0048758 A1 * | 3/2005 | Hosseini et al. | 438/614 |
| 2005/0135041 A1 | 6/2005 | Kang et al. | |
| 2005/0212106 A1 | 9/2005 | Kwon et al. | |
| 2005/0242426 A1 | 11/2005 | Kwon et al. | |
| 2005/0275082 A1 | 12/2005 | Ferrara et al. | |
| 2006/0055027 A1 * | 3/2006 | Kitabatake et al. | 257/706 |
| 2006/0071237 A1 | 4/2006 | Deboy et al. | |
| 2006/0113657 A1 | 6/2006 | Ejury | |
| 2006/0175627 A1 | 8/2006 | Shiraishi | |
| 2006/0197220 A1 | 9/2006 | Beer | |
| 2006/0268645 A1 | 11/2006 | Graf et al. | |
| 2007/0063231 A1 | 3/2007 | Briere | |
| 2007/0096254 A1 | 5/2007 | Ritter et al. | |
| 2007/0176299 A1 | 8/2007 | Otremba | |
| 2007/0229143 A1 | 10/2007 | Eckhardt et al. | |
| 2008/0105907 A1 | 5/2008 | Otremba et al. | |

FOREIGN PATENT DOCUMENTS

| | | |
|---|---|---|
| DE | 102004023307 B3 | 10/2005 |
| JP | 06005881 | 1/1994 |
| JP | 2004200665 | 7/2004 |
| WO | 0039853 | 7/2000 |

* cited by examiner

SEMICONDUCTOR MODULE WITH A SEMICONDUCTOR CHIP AND A PASSIVE COMPONENT AND METHOD FOR PRODUCING THE SAME

CROSS REFERENCE TO RELATED APPLICATIONS

The present application is a continuation of U.S. Nonprovisional application Ser. No. 11/782,125, filed 24 Jul. 2007 and entitled "Semiconductor Module with a Power Semiconductor Chip and a Passive Component and Method for Producing the Same," which claims priority under 35 USC §119 to Application No. DE 102006034679.3 filed on 24 Jul. 2006 and entitled "Semiconductor Module with Power Semiconductor Chip and Passive Component and Method for its Production." The disclosure of each of the aforementioned applications is hereby incorporated by reference in its entirety.

BACKGROUND

Known semiconductor modules include electrodes arranged on a plastic package with an embedded semiconductor chip in such a way that a further semiconductor device with surface-mountable external contacts and/or a passive discrete component with surface-mountable external contacts can be stacked on the package to form a semiconductor module.

In the case of a power semiconductor module, power semiconductor chips that have a large-area and relatively stable semiconductor body are used. Power semiconductor chips of this type have electrodes of such a large area that they cover almost an entire external face (i.e., top side or back side) of the power semiconductor chip.

A disadvantage of these known semiconductor modules is that first a complete semiconductor device with: a plastic package, a plastic package molding compound and external contacts is produced on the semiconductor chip, which entails high costs. This packaged semiconductor device is then loaded with a passive and discrete component, which likewise has a package. A semiconductor module of this type has not only the disadvantage of complete individual fabrication of individual components before they are stacked but also the disadvantage that it provides a semiconductor module that is not created with the smallest possible space requirement. Finally, another concern is that the stacked passive discrete component is merely mechanically fixed by its surface-mountable electrodes to the external contacts of the base semiconductor device that are arranged under it, and is not protected by a plastic package molding compound.

Conventional power switching modules for supplying current and voltage to the on-board electrical systems of a vehicle, an aircraft or a stationary installation have circuit boards which are arranged with packaged discrete power semiconductor chips and with separately packaged, discrete passive components such as capacitors or resistors alongside the packaged discrete power semiconductor chip on a wiring structure of the circuit board. As a result, the two-dimensional extent of a conventional power switching module is made up of the surface area of the power semiconductor package with the power semiconductor chip and the package of the passive component, as well as the common wiring, which disadvantageously requires considerable surface area and space.

SUMMARY

A semiconductor module with a power semiconductor chip and a passive discrete component and a method for producing the same are described herein. The semiconductor chip includes on its top side and/or on the back side a large-area contact, which in its two-dimensional extent takes up the top side and/or the back side of the semiconductor chip virtually completely. The passive component, arranged in a package, is stacked on one of the large-area contacts. The electrode of the passive component is electrically connected with one of the large-area contacts. The counter electrode of the passive component is operatively connected with a control or signal electrode of the power semiconductor chip or an electrode of a further semiconductor chip.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is now explained in more detail on the basis of the accompanying figures, where.

DETAILED DESCRIPTION

Figure 1:
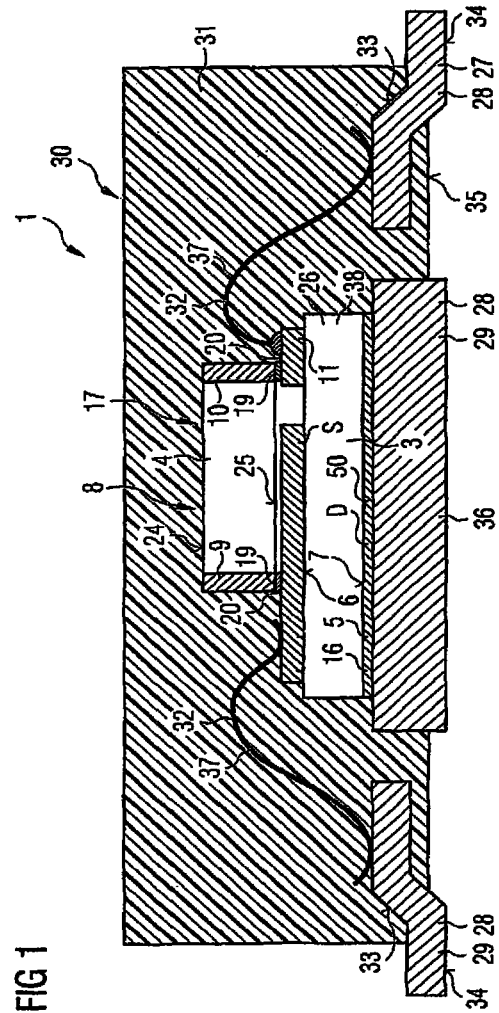
FIG. 1 shows a schematic cross section through a power semiconductor module of a first embodiment.

Described herein is a semiconductor module of spatially smaller dimensions, with at least one power semiconductor chip, which can switch electric power outputs and comprises at least one additional passive discrete component. The power semiconductor chip comprises a large-area contact on the top side and/or the back side. The two-dimensional extent of large-area contacts of this type covers the top side and/or the back side of the semiconductor chip virtually completely. The passive discrete component, arranged in a package, is stacked on one of the large-area contacts. The electrode of this passive component is electrically connected with one of the large-area contacts of the power semiconductor chip. The counter electrode of the passive component is in operative connection with a small-area control or signal electrode of the power semiconductor chip or an electrode of a further semiconductor chip.

A small area contact is understood in this context as meaning a contact that emits signals, for example for controlling the power semiconductor chip or for providing the clock timing for a control circuit integrated in the semiconductor body of the power semiconductor chip. A large area contact is understood in this context as meaning a contact that covers virtually the entire top side and/or back side of the semiconductor chip and is consequently intended for carrying high levels of current.

An advantage of the described semiconductor module is that ready-made passive discrete components of standard production can be used, provided that they have the appropriate dimensions and are smaller than or the same sizes as a power semiconductor chip in their two-dimensional extent. Since the power semiconductor chips become larger in their two-dimensional extent as permissible current loading increases, the possibilities of positioning passive discrete and already packaged components on a power semiconductor chip are advantageously increased. For instance, discrete capacitors of up to 100 nF can be advantageously fixed on power semiconductor chips of this type. Power semiconductor chips are therefore suitable as base semiconductor chips for a stack comprising a power semiconductor chip and at least one passive discrete component.

In the case of an exemplary embodiment, the passive component is arranged on the top side of the power semiconductor chip by POC (package-on-chip) mounting. POC mounting is a standard method, which however has not so far been used for power semiconductor chips, especially since the large-area contacts on the top side and/or on the bottom side of power semiconductor chips of the power semiconductor devices are used for attaching heat sinks or cooling elements. However, it has been found that the passive components mounted on the top side of a power semiconductor chip are also quite capable of contributing to the thermal relief of the power semiconductor chip.

In an exemplary embodiment, the semiconductor module comprises a stack with a power semiconductor chip and with a coupling capacitor, which is wired in the semiconductor module as a high-pass filter or a low-pass filter. Coupling capacitors of this type are used as a low-pass filter to keep high-frequency interference signals and/or clock signals away from electrodes of the downstream circuit components. The coupling capacitors are only wired as a high-pass filter if the power semiconductor chip is intended to supply a radio-frequency stage (e.g., in the antenna circuit of a cell phone).

The semiconductor module optionally includes a stack with a power semiconductor chip and with a coupling capacitor, the coupling capacitor being wired in the semiconductor module as a boot capacitor. This semiconductor module is optionally used in the on-board electronic system for "supplying current and power", in particular for AC/DC and the DC/DC converters with increased and improved degrees of integration, the boot capacitor being used to store a charge that can be called upon when there is an increased power demand or the charge being used for smoothing the converter voltage. In today's converters, passive components of this type are, as mentioned above, arranged along with the active components in the form of power semiconductor devices on a substrate and consequently take up considerable space on account of the required rerouting on the circuit board of the converter.

The POC mounting mentioned above optionally allows the boot capacitor with a capacitance $C_B$ of $5 \text{ nF} \leq C_B \leq 100 \text{ nF}$ to be installed together with the active components (e.g., power MOSFET and/or integrated circuits), in the form of multichip modules (MCM). This advantageously leads to a compact semiconductor module that is optimized in its three-dimensional and two-dimensional extent.

In an exemplary embodiment, the stacked passive component comprises surface-mountable external contacts, which are coated with a diffusion solder material. This diffusion solder material makes it possible to apply the passive discrete component to the power semiconductor chip at diffusion soldering temperature under a predetermined contact pressure. This causes the formation of intermetallic phases, which have a higher melting point than the diffusion soldering temperature of the diffusion solder material. Consequently, the passive discrete component is then also reliably and securely fixed on the power semiconductor chip for the subsequent process temperatures. A material from the group including: AuSn, AgSn, CuSn or AgIn is optionally used as the diffusion solder material. In this case, the diffusion solder layer within the semiconductor module connects a large-area power electrode of a semiconductor chip electrically and mechanically to an electrode of the passive component.

In the case of an exemplary embodiment, the power semiconductor chip comprises an HSS (high-side switch) with a power MOSFET and with an integrated gate driver. In this case, the stacked passive discrete component is arranged between the source electrode of the HSS and the $C_B$ input of the gate driver IC. With this exemplary embodiment of a semiconductor module, the large-area extent of the power semiconductor chip with integrated control circuit is optimally used to stack at least one passive discrete component on its top side in an area- and space-saving manner.

A further exemplary embodiment provides that the passive component is arranged as a spacer between two semiconductor chips and has electrodes, which can be contacted from the top side and from the back side of the passive component. For this purpose, standard passive discrete components are equipped with novel external electrodes, which, for example, include on the outer sides of the package of the passive component a metallization which connects a surface-mountable terminal of the passive component on the underside of the package to a contact area on the top side of the package of the passive component. This makes it possible for the passive component not only to serve as a spacer but also to be able to be electrically connected to a further stacked semiconductor chip.

Optionally, the semiconductor module comprises a semiconductor chip with an integrated power circuit and a further semiconductor chip with a power semiconductor transistor. A boot capacitor is wired as a spacer in the semiconductor module between the integrated power circuit and the power semiconductor transistor. A power circuit is understood in this context as meaning a semiconductor body that includes both a power semiconductor transistor and an integrated circuit, which for example activates the power transistor in a pulse-width modulation. For this purpose, the integrated circuit may comprise one or more clock generators.

In a further exemplary embodiment, the power semiconductor chip with the passive component includes as a spacer on its top side and on its back side a power electrode with a large-area contact. The top side and the back side of the power semiconductor chip additionally include a small-area control electrode. One of the power electrodes may be a drain electrode and another of the power electrodes may be a source electrode of a vertical field-effect power semiconductor chip, while the small-area control electrode is a vertical trench gate electrode. In the case of an exemplary embodiment, a collector electrode and an emitter electrode of a vertical IGBT (insulated gate bipolar transistor) are provided as power electrodes, while the control electrode is an insulated gate electrode.

For the further construction of a semiconductor module of this type, the stack with the power semiconductor chip and the passive component is fixed on leads. The surface-mountable external contacts of the semiconductor module are formed by these leads. At least one lead is in this case intended for signal inputs and/or signal outputs. Further leads for supply currents and supply voltages may be arranged in a leadframe.

Furthermore, the semiconductor module comprises a plastic package, in the plastic package molding compound of which at least one power semiconductor chip, a passive component, connecting elements and surfaces of leads are embedded. However, the external contact areas of the leads on the underside of the semiconductor module are kept free of plastic package molding compound.

An exemplary application for this semiconductor module is in on-board electrical systems of an MCM design (multichip module design). A further area of application for the semiconductor module is in supplying current and voltage with an AC/DC and/or DC/DC converter, the semiconductor module providing at least one of the converters.

A method for producing a semiconductor module with a power semiconductor chip and a stacked passive component comprises the following method steps. First, a power semiconductor chip or a power semiconductor circuit chip is produced. The difference between a power semiconductor chip and a power semiconductor circuit chip is that a power semiconductor circuit chip includes in addition to the power semiconductor chip also an integrated circuit. Furthermore, a passive component with a component package is produced. Additionally, a leadframe with semiconductor module positions and leads is produced.

With these three components, the semiconductor module is then assembled. For this purpose, a power semiconductor chip or a power semiconductor circuit chip is applied to the respective semiconductor module positions. This can then be followed by application of a passive component on the power semiconductor chip or the power semiconductor circuit chip. Subsequently, connecting elements are attached, arranged between the leads and the electrodes of the power semiconductor chip and/or of the power semiconductor circuit chip and/or of the passive component. After that, this stacked structure comprising at least one power semiconductor chip and/or a power semiconductor circuit chip and a passive discrete component and connecting elements can be embedded in a plastic package molding compound, while leaving external contacts of the leads free. Finally, the leadframe is divided up into individual semiconductor modules.

This method has the advantage that a large number of steps that contribute to the assembly of the semiconductor module can be carried out for a plurality of semiconductor modules in parallel on the leadframe. Furthermore, the method can be applied to a number of power semiconductor chips that are stacked one on top of the other and are kept at a distance by a passive component.

In an exemplary embodiment of how the method is carried out, diffusion solder layers of a diffusion solder material, which comprises at least one of the substances AuSn, AgSn, CuSn and/or InAg and during diffusion soldering forms intermetallic phases of which the melting point is much higher than a diffusion soldering temperature, are applied to the electrodes of the passive component. For the diffusion soldering, the stack comprising the power semiconductor chip and the passive component is heated up to a diffusion soldering temperature $T_D$ of $180°\,C.\leq T_D \leq 450°\,C$. During the diffusion soldering, a contact pressure is optionally exerted on the passive component in order to ensure contact-making during the heating-up to diffusion soldering temperature.

For this purpose, a MOSFET with a vertical drift region and a vertical trench gate structure as well as with a source electrode on its top side and a drain electrode on its back side may be applied in the semiconductor chip positions, an electrode of the passive component being diffusion-soldered onto the source electrode. The other electrode may then be connected to a lead via a connecting element such as a bonding wire or it may also be in operative connection with a control or signal electrode on the power semiconductor chip.

To produce leadframes, optionally, planar copper plates can be patterned, in that a planar metal plate is stamped or is wet or dry etched. Instead of a patterning of a metal plate, it is also possible to produce the leadframe by electrodepositing the leadframe pattern on an auxiliary carrier and subsequently removing the auxiliary carrier from the leadframe obtained.

In the then following application of a power semiconductor chip to the provided leads in corresponding semiconductor module positions, the power semiconductor chip is soldered onto a central lead, which is also known as a semiconductor chip island or as a "chip pad".

To provide connecting elements between electrodes of the top side of the power semiconductor chip and provided leads of the leadframe in the semiconductor module positions, bonding-wire connections or bonding-tape connections are applied between the leads and the electrodes. To package the stack comprising at least one power semiconductor chip and a passive component as well as the connecting element, these components are embedded in a plastic package molding compound, while leaving external contact areas of the leads on the underside of the semiconductor module free, via an injection-molding technique or a dispensing technique.

After embedding the individual semiconductor modules in their plastic package in the individual semiconductor module positions of the leadframe, the latter is divided up into individual power semiconductor modules via a separating technique (e.g., a laser technique, an etching method, a sawing technique or a punching technique).

In the following paragraphs, exemplary embodiments of the device and method are described in connection with the figures.

FIG. 1 shows a schematic cross section through a power semiconductor module 1 of a first embodiment. This power semiconductor module 1 comprises an integrated power circuit 26 of a monolithically integrated semiconductor body 38 of a power semiconductor chip 3 with a power transistor of the MOSFET type (metal oxide silicon field-effect transistor) and an integrated circuit with a gate driver. This power semiconductor circuit chip 26 has on its back side 7 a large-area contact 5, which occupies virtually the entire surface of the back side 7 of the power semiconductor chip 3 and is a drain electrode D of a MOSFET.

With this power electrode 16, which may be connected as a drain electrode D, the power semiconductor chip 3 is arranged on a central lead 36, which is also referred to as a chip island or chip pad, of a leadframe. A leadframe of this type has a plurality of semiconductor module positions. Apart from the central lead 36, the semiconductor module 1 has further current-carrying leads 29 for carrying current, the leads 29 being connected to a power electrode 16 on the top side 6 of the power semiconductor circuit chip 26 by way of a bonding-tape connection 37 and representing the terminal for a source electrode S.

An electrode 9 of a passive component 4 is arranged on this large-area power electrode 16 via a surface-mountable external contact 19 of the passive component 4 and via a diffusion solder layer 20. The discrete passive component 4 has a package 8, a top side 24 and a back side 25 and its counter electrode 10 is fixed, in turn via a diffusion solder layer 20, on a signal electrode 11 by a surface-mountable external contact 19 of the counter electrode 10. Since this signal electrode 11, which belongs to the integrated gate driver, is arranged on the top side 6 of the power semiconductor circuit chip 26, it is connected to a lead 27 for signals via a connecting element 32, which here forms a bonding-wire connection 37. The power transistor of the MOSFET type that is arranged in the semiconductor body 38 can be activated via an external contact area 34.

Since a boot capacitor of approximately 10 nF has a size of 250 times 500 µm$^2$, with today's power packages, such as for example TO, Power SO or Power QFN packages, the boot capacitor can be fixed on the power semiconductor chip 3 with an integrated power circuit 26 as a stacked passive discrete component 4. The diffusion solder connection of the surface-mountable contacts 20 of the passive component 4 have the effect at the same time of creating a high-temperature-resistant soldered connection that can withstand the further thermal production processes undamaged.

The two-dimensional extent of the available power semiconductor chip 3 with the integrated power circuit 26 makes it possible to stack boot capacitors of this type in a package 8 on the power semiconductor chip 3, and to embed this arrangement comprising power semiconductor chip 3, passive component 4, connecting elements 32 and surfaces 33 of the leads 27 and 29 in a plastic package molding compound 31 to form a plastic package 30. Created at the same time on the underside 35 of the semiconductor module 1 are plastic-free external contacts 28 with external contact areas 34. External access is possible via the external contacts 28 to a source electrode S, a drain electrode D and a signal electrode 11 in the stack 17 comprising power semiconductor chip 3 and passive discrete component 4.

Figure 2:
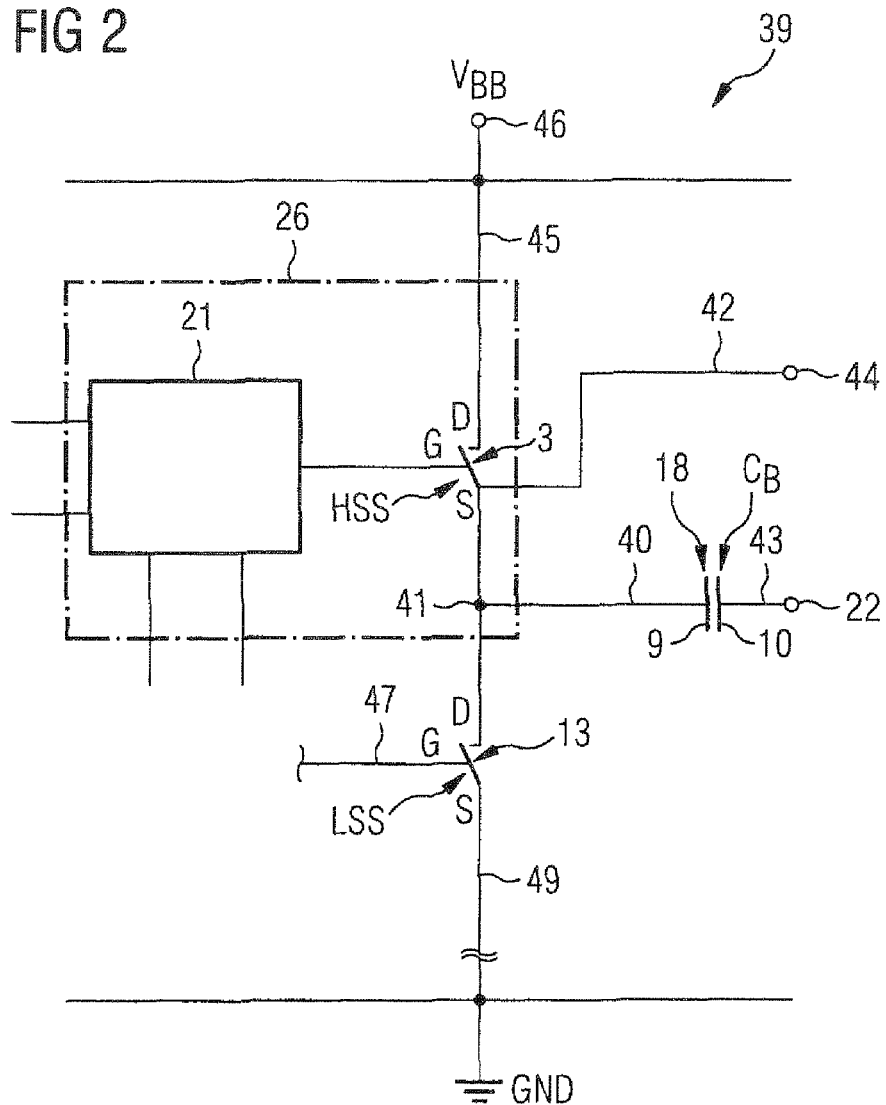
FIG. 2 shows a basic diagram of a detail of a circuit with a low-side switch and a high-side switch.

FIG. 2 shows a basic diagram of a detail of a circuit 39 with a further semiconductor chip 13 as an LSS (low-side switch) and a power circuit 26, comprising a power transistor 3 as an HSS (high-side switch) with an integrated control circuit 21, and with a boot capacitor $C_B$ as a passive discrete component 4 for the coupling of a gate driver input 22. The two switches LSS and HSS are connected in series between a ground terminal GND and a supply voltage terminal $V_{BB}$. The boot capacitor $C_B$ is connected to an electrode 9 between the two power transistors via a connection 40. While the low-side switch is connected by its source electrode S to the grounding point GND, the drain electrode D of the low-side switch and the source electrode S of the high-side switch form with the electrode 9 of the boot capacitor $C_B$ a node point 41 of the circuit arrangement 39. The next following FIG. 3 shows how this circuit arrangement 39 is realized with the three external terminals, 22 for the $C_B$ input, 44 for the HSS source electrode and 46 for the HSS drain electrode.

For this purpose, a connecting line 42 connects the terminal point 44 to the source electrode S of the power semiconductor chip 3, and a connecting line 47 is connected to the gate electrode G of the LSS. A further connecting line 49 is arranged between the source electrode S of the LSS and GND. Furthermore, the node point 41 is electrically coupled via the connection 40 to the electrode 9 of the boot capacitor $C_B$, and a connecting line 43 connects the counter electrode 10 of the boot capacitor $C_B$ to the external terminal 22. Finally, the external terminal 46 is electrically in connection with the drain electrode D of the HSS via the connection 45.

Figure 3:
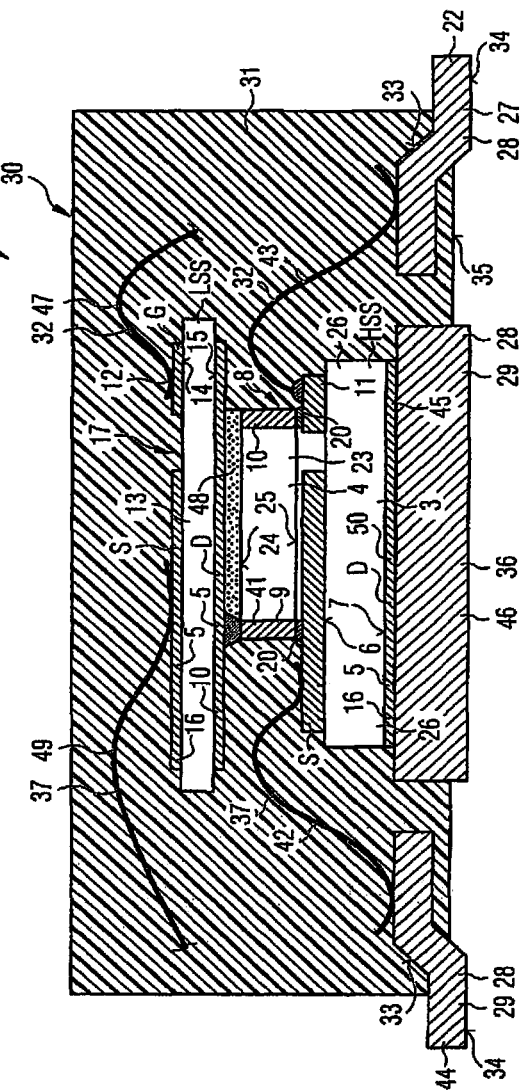
FIG. 3 shows a schematic cross section of a power semiconductor module of a second embodiment.

FIG. 3 shows a schematic cross section of a power semiconductor module 2. Components with the same functions as in FIG. 1 are identified by the same designations and are not separately explained. The power semiconductor module 2 realizes the circuit arrangement 39 shown in FIG. 2, with a stack 17 comprising power semiconductor chip 26 and passive boot capacitor 18 as passive discrete component 4 and further stacked semiconductor chip 13 for an on-board electrical system. In this case, the boot capacitor 18 additionally serves mechanically as a spacer 23 between the HSS and the LSS. The LSS is formed by the further stacked semiconductor chip 13 with a large-area source electrode S and a small-area electrode 12 as gate electrode G on its top side 14 and a large-area drain electrode D on its back side 15.

The HSS-drain external terminal 46 shown in FIG. 3 is realized by a central lead 36, while the external terminal for the CB input 22 is realized by a signal lead 27 that is arranged at the edge of the underside 35 of the plastic package 30. On the opposite edge of the underside of the plastic package 30, the HSS-source external terminal 44 is realized by a lead 29 for supplying current. Finally, the external terminal 46 is electrically connected with the HSS via a connection 45, which is arranged as a solder layer 50 between the central lead 36 and the drain electrode D.

The node point 41 of the circuit arrangement 39 in FIG. 3 is realized by soldering the capacitor electrode 9 onto the power electrode 16 of the power semiconductor chip 3, which is formed here as a high-side switch. The electrode 9 of the passive component 4 is also electrically connected to the drain electrode D of the low-side switch, which on the passive component 4 is fixed via an adhesive layer 48 on the top side 24 of the passive component 4. The connecting lines 42, 43, 47 and 49 shown in FIG. 3 are realized by corresponding bonding-wire or bonding-tape connections 32 in the power semiconductor module 2.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor module comprising:
   a semiconductor chip including:
      a control electrode disposed on a portion of an external face of the semiconductor chip, and
      a contact having a two-dimensional extent that substantially covers a remaining portion of the external face; and
   a passive discrete component arranged in a package and stacked on the contact, the passive discrete component comprising:
      an electrode having a side facing the semiconductor chip and attached to the contact of the semiconductor chip such that the electrode is electrically connected to and fixed on the contact, and
      a counter electrode having a side facing the semiconductor chip and attached to the control electrode of the semiconductor chip such that counter electrode is electrically connected to and fixed on the control electrode.

2. The semiconductor module according to claim 1, wherein the passive discrete component comprises a coupling capacitor wired with the semiconductor chip as a stack of the semiconductor module as a high-pass filter or a low-pass filter.

3. The semiconductor module according to claim 1, wherein the passive discrete component comprises a coupling capacitor wired with the semiconductor chip as a stack of the semiconductor module as a boot capacitor.

4. The semiconductor module according to claim 3, wherein:
   the boot capacitor has a capacitance $C_B$; and
   $5 \text{ nF} < C_B \leq 100 \text{ nF}$.

5. The semiconductor module according to claim 1, wherein:
   the passive discrete component further comprises first and second surface-mountable external contacts coated with a diffusion solder material;
   the electrode of the passive discrete component is fixed to the contact of the semiconductor chip via the first surface-mountable external contact; and the counter electrode of the passive discrete component is fixed to the control electrode of the semiconductor chip via the second surface-mountable external contact.

6. The semiconductor module according to claim 5, wherein the diffusion solder material comprises material selected from the group consisting of AuSn, AgSn, CuSn, and AgIn.

7. A semiconductor module comprising:
a semiconductor chip defining a first surface and a second surface, the semiconductor chip including:
a control electrode disposed on the first surface of the semiconductor chip, the control electrode covering a portion of the first surface, and
a contact disposed on the first surface of the semiconductor chip, the contact substantially covering a remaining portion of the first surface; and
a passive discrete component arranged in a package and stacked on the contact, the passive discrete component comprising:
an electrode facing the semiconductor chip and attached to and fixed on the contact of the semiconductor chip, and
a counter electrode facing the semiconductor chip and attached to and fixed on the control electrode of the semiconductor chip.

8. The semiconductor module according to claim 7, wherein the passive discrete component comprises a coupling capacitor wired with the semiconductor chip as a stack of the semiconductor module as a high-pass filter or a low-pass filter.

9. The semiconductor module according to claim 7, wherein the passive discrete component comprises a coupling capacitor wired with the semiconductor chip as a stack of the semiconductor module as a boot capacitor.

10. The semiconductor module according to claim 9, wherein:
the boot capacitor has a capacitance $C_B$; and
$5 \text{ nF} < C_B \leq 100 \text{ nF}$.

11. The semiconductor module according to claim 7, wherein:
the stacked passive discrete component further comprises first and second surface-mountable external contacts coated with a diffusion solder material;
the electrode of the passive discrete component is fixed to the contact of the semiconductor chip via the first surface-mountable external contact; and
the counter electrode of the passive discrete component is fixed to the control electrode of the semiconductor chip via the second surface-mountable external contact.

12. The semiconductor module according to claim 11, wherein the diffusion solder material comprises material selected from the group consisting of AuSn, AgSn, CuSn and AgIn.

13. A semiconductor module comprising:
a chip pad;
a power semiconductor chip having a top side and a back side opposite the top side, the back side facing the chip pad, the power semiconductor chip including:
a first contact that emits signals, and
a second contact for carrying current; and
a passive discrete component arranged on the first contact, the passive discrete component comprising:
an electrode facing the power semiconductor chip and attached to the second contact of the power semiconductor chip, and
a counter electrode facing the power semiconductor chip and attached to the first contact of the power semiconductor chip.

14. The semiconductor module of claim 13, wherein both the first contact and the second contact are disposed on the top side of the power semiconductor chip.

15. The semiconductor module of claim 14, further comprising a third contact disposed on the back side of the power semiconductor chip.

16. The semiconductor module of claim 15, wherein the third contact occupies virtually the entire surface of the back side of the power semiconductor chip.

17. The semiconductor module of claim 16, wherein the third contact is a drain electrode of a MOSFET.

18. The semiconductor module of claim 17, wherein:
the power semiconductor chip is arranged over the chip pad; and
the passive device is arranged over the power semiconductor chip.

19. The semiconductor module of claim 18 further comprising:
a first lead for carrying signals connected to the first contact; and
a second lead for carrying current connected to the second contact.

20. The semiconductor module of claim 19, wherein:
the counter electrode of the passive discrete component is fixed to the first contact via a first diffusion solder layer; and
the electrode of the passive discrete component is fixed to the second contact via a second diffusion solder layer.

* * * * *